United States Patent
Kurashima et al.

(10) Patent No.: US 7,170,027 B2
(45) Date of Patent: Jan. 30, 2007

(54) MICROWAVE PLASMA PROCESSING METHOD

(75) Inventors: Hideo Kurashima, Yokohama (JP); Akira Kobayashi, Yokohama (JP); Kouji Yamada, Yokohama (JP); Tsunehisa Namiki, Yokohama (JP)

(73) Assignee: Toyo Seikan Kaisha Ltd., Tokyo (JP)

( * ) Notice: Subject to any disclaimer, the term of this patent is extended or adjusted under 35 U.S.C. 154(b) by 0 days.

(21) Appl. No.: 10/550,509

(22) PCT Filed: Apr. 12, 2004

(86) PCT No.: PCT/JP2004/005202
§ 371 (c)(1),
(2), (4) Date: Sep. 22, 2005

(87) PCT Pub. No.: WO2004/092443

PCT Pub. Date: Oct. 28, 2004

(65) Prior Publication Data
US 2007/0000879 A1    Jan. 4, 2007

(30) Foreign Application Priority Data
Apr. 16, 2003    (JP)    .............................. 2003-112134

(51) Int. Cl.
*B23K 9/00*    (2006.01)
(52) U.S. Cl. .................................... 219/121.43; 216/70
(58) Field of Classification Search ........... 219/121.43, 219/121.36, 121.41, 121.44, 121.45, 121.47; 156/345.41; 204/298.37, 298.38; 216/67, 216/69, 70; 427/237, 249.1, 575
See application file for complete search history.

(56) References Cited

U.S. PATENT DOCUMENTS 5,580,420 A * 12/1996 Watanabe et al. .............. 216/69
5,762,814 A *  6/1998 Ohara et al. ................... 216/70
6,582,778 B1 *  6/2003 Namiki et al. ............... 427/575

FOREIGN PATENT DOCUMENTS

JP    2002-153830    5/2002
WO    99/17334    4/1999

\* cited by examiner

*Primary Examiner*—Quang Van
(74) *Attorney, Agent, or Firm*—Manabu Kanesaka

(57) ABSTRACT

A microwave plasma processing method is provided which enables a uniform thin film layer to be formed on a surface to be processed and which enables a short time processing. In the microwave plasma processing method, microwaves are introduced into a plasma processing chamber 1, and a processing gas is transformed into plasma to form a thin film layer on a base substance 13 disposed in the plasma processing chamber 13, and the method comprises: fixing the base substance 13 coaxially with a central axis of the plasma processing chamber 1; setting a standing wave mode of the microwaves in the plasma processing chamber to a TE mode or a TEM mode from a mouth portion 131 to a body portion 133 of the base substance; and setting a mode having both the TE mode and a TM mode in a bottom portion 132 of the base substance.

5 Claims, 3 Drawing Sheets

(a) TE MODE (b) TM MODE (c) TE MODE

MICROWAVE PLASMA PROCESSING METHOD

TECHNICAL FIELD

The present invention relates to a microwave plasma processing method, and more particularly, it relates to a microwave plasma processing method which, when a chemical vapor deposition film is formed in a plastic container, enables a uniform thin film layer to be formed in the container in a short processing time by causing plasma to act uniformly and efficiently on the container.

BACKGROUND ART

A chemical vapor deposition method (CVD) is a technique to precipitate, by use of a processing gas that does not react at room temperature, a reaction product in a film state on a surface of an object to be processed through vapor-phase growth in a high-temperature atmosphere, and this method is widely employed for such purposes as manufacture of semiconductor, and surface modification of metals and ceramics. Recently, the CVD, especially low-pressure plasma CVD, has been increasingly applied to surface modification of plastic containers, particularly to improvement of gas barrier properties.

The plasma CVD uses plasma for growth of thin film. In this method, basically, a gas including the processing gas is caused to discharge electricity by high-field electric energy under decompression, and a substance thus produced through dissociation and bonding is chemically reacted in gas phase or on the object to be processed, thereby depositing the substance on the object to be processed.

A plasma state is accomplished by glow discharge, corona discharge and arc discharge, and known methods of the glow discharge include, for example, a method utilizing direct current glow discharge, a method utilizing high-frequency glow discharge, and a method utilizing microwave discharge.

Among these methods, the method utilizing microwave discharge allows configuration of an apparatus to be significantly simplified. Moreover, when an internal surface of the plastic container is to be processed, a degree of decompression in the apparatus may be such that the microwave discharge is caused only in the plastic container. Therefore, it is not necessary to maintain a high vacuum entirely in the apparatus, leading to simple operation and superior productivity.

The following is a method disclosed as a microwave plasma processing method directed to the plastic containers. For example, a bottle is disposed in a cylindrical microwave confining chamber coaxially with a central axis of the microwave confining chamber. Then, air is exhausted simultaneously from spaces inside and outside the bottle, and the processing gas is put into the bottle for a predetermined processing time. Additionally, microwaves are introduced into the microwave confining chamber, and the microwaves in the microwave confining chamber are set in a TM resonance mode, and then plasma is ignited and maintained inside the bottle, thereby processing the bottle.

However, the above method has a problem in that a uniform thin film can not be formed on the container to be processed because the plasma state in the microwave confining chamber is unstable and strength distribution of plasma is formed in an axial direction of the confining chamber.

Another problem is that the processing period is long due to difficulty in causing plasma emission. Still another problem is that a nozzle to supply the processing gas is easily fouled.

In view of the foregoing problems, an object of the present invention is to provide a microwave plasma processing method capable of forming a uniform thin film on a surface of an object to be processed, and accomplishing the processing in a short time.

DISCLOSURE OF THE INVENTION

In order to solve these problems, as a result of thorough studies, the present inventors have completed the present invention after finding out that plasma can be caused to efficiently act on a base substance and electric field strength can be almost uniform in the processing surface of the base substance by adjusting standing waves of microwaves in a plasma processing chamber and forming an electric field in a direction vertical to the processing surface of the base substance.

More specifically, the present invention concerns a microwave plasma processing method for introducing microwaves into a plasma processing chamber, and transforming a processing gas into plasma to form a thin film layer on a base substance disposed in the plasma processing chamber. This microwave plasma processing method comprises fixing the base substance coaxially with a central axis of the plasma processing chamber; setting a standing wave mode of the microwaves in the plasma processing chamber to a TE mode or a TEM mode from a mouth portion to a body portion of the base substance; and setting both the TE mode and a TM mode in a bottom portion of the base substance.

In this way, the electric field is produced from the central axis of the plasma processing chamber toward a wall surface of the plasma processing chamber, so that the produced plasma is accelerated from the vicinity of the center of the processing chamber toward an inner wall of the base substance. Therefore, a thin film can be efficiently formed on the base substance.

Furthermore, as the electric field strength on the surface of the base substance can be almost uniform, the thin film layer formed by the plasma can be uniform.

It is to be noted that the mouth portion of the base substance includes the mouth portion and its peripheral portions in the present specification. Similarly, the body portion of the base substance includes the body portion and its periphery, and the bottom portion of the base substance includes the bottom portion and its periphery.

Furthermore, it is preferable in the above-described processing method of the present invention that a metallic processing gas supply member is inserted into the base substance on the central axis of the plasma processing chamber as not to reach the bottom portion of the base substance.

Thus, the metallic processing gas supply member is provided along the axis of the plasma processing chamber such that a so-called semi-coaxial cylindrical resonance system can be formed in the plasma processing chamber. In this resonance system, the standing wave mode of the microwaves can be set to the TE mode or the TEM mode from one end to an end portion of the supply member, and can be set to a state having both the TE mode and the TM mode in an area beyond the end portion of the supply member where the supply member is not present.

Furthermore, in the present invention, the microwaves are preferably supplied to the plasma processing chamber from a side surface of the plasma processing chamber at a position between the mouth portion and the bottom portion of the base substance.

This makes it easy to stabilize electric field strength distribution in the plasma processing chamber, and allows efficient use of microwave energy. Moreover, a plasma state is stabilized with the result that a uniform thin film is formed on the surface of the base substance.

Furthermore, in the present invention, the mode of the microwaves before introduced into the plasma processing chamber is set to the TE mode and the TM mode.

This efficiently converts the plasma processing chamber into the above-described microwave mode in the present invention.

Furthermore, in the present invention, a degree of vacuum inside the base substance is preferably higher than a degree of vacuum outside the base substance.

In this way, because the electric field concentrates in the vicinity of wall surface of the base substance when plasma is produced with a high degree of vacuum inside the base substance, the thin film layer is efficiently formed.

BEST MODE FOR CARRYING OUT THE INVENTION

One embodiment will be described below in which a microwave plasma processing method of the present invention is applied to processing of an internal surface of a bottle. The bottle in this embodiment includes a biaxial stretching blow molded bottle formed of polyester such as polyethylene terephthalate.

[Microwave Plasma Processing Apparatus]

Figure 1:
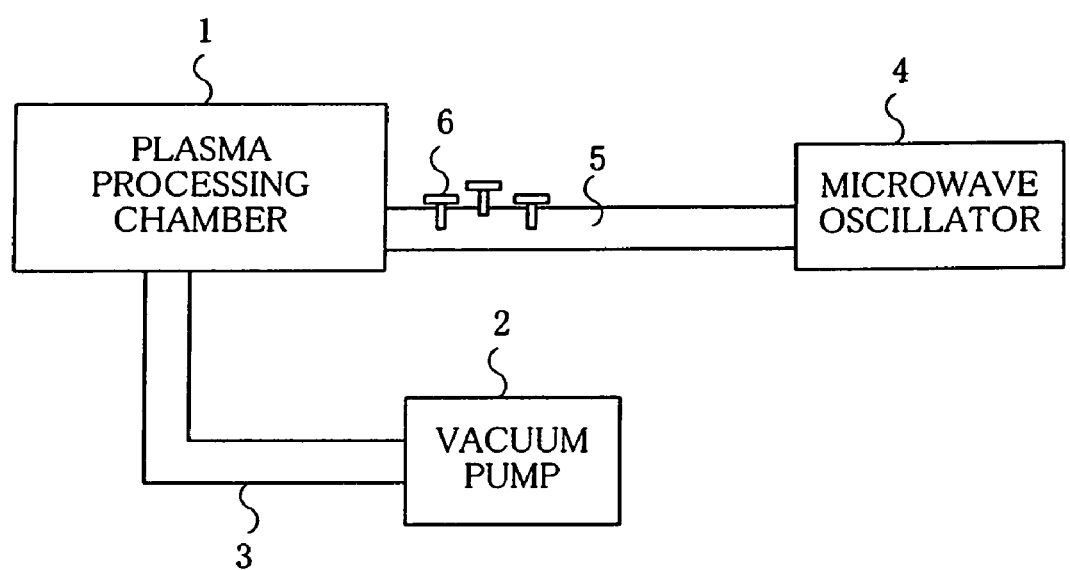
FIG. 1 is a schematic arrangement view of a microwave plasma processing apparatus according to one embodiment of the present invention.

FIG. 1 is a schematic arrangement view of an apparatus for implementing the microwave plasma processing method of the present embodiment.

A vacuum pump 2 for exhausting air in a plasma processing chamber 1 and maintaining a decompressed state is connected to the plasma processing chamber 1 via an exhaust tube 3. Further, a microwave oscillator 4 is connected via a waveguide 5 which is microwave introducing means. It is to be noted that three tuners 6 may be provided to adjust an amount of microwave reflection from the processing chamber to the minimum.

However, the tuners 6 can only reduce the reflection amount compulsorily and can not form an excellent resonance system in the plasma processing chamber 1. It is to be noted that the plasma processing apparatus described below can be used to form the excellent resonance system in the plasma processing chamber 1, which enables efficient processing to be performed without using adjusting means such as the tuners 6.

The microwave oscillator 4 is not specifically limited as long as it can generate microwaves which can act on a processing gas to cause a glow discharge, and commercially available microwave oscillators can generally be used.

The waveguide 5 to be used efficiently transmits the microwaves generated by the microwave oscillator 4 to the processing chamber 1 and is suitable for the wavelength of microwaves to be used.

Here, there are various connection forms of the microwave oscillator 4 and the processing chamber 1 in addition to the direct connection of the microwave oscillator 4 and the processing chamber 1 via the waveguide 5 as shown in FIG. 1, and, for example, the microwave oscillator 4 and the processing chamber 1 can also be connected via a coaxial cable or the like. In addition, a position to connect the coaxial cable can be changed to change a microwave mode before introduction into the processing chamber 1 to a TE mode or a TM mode.

Figure 2:
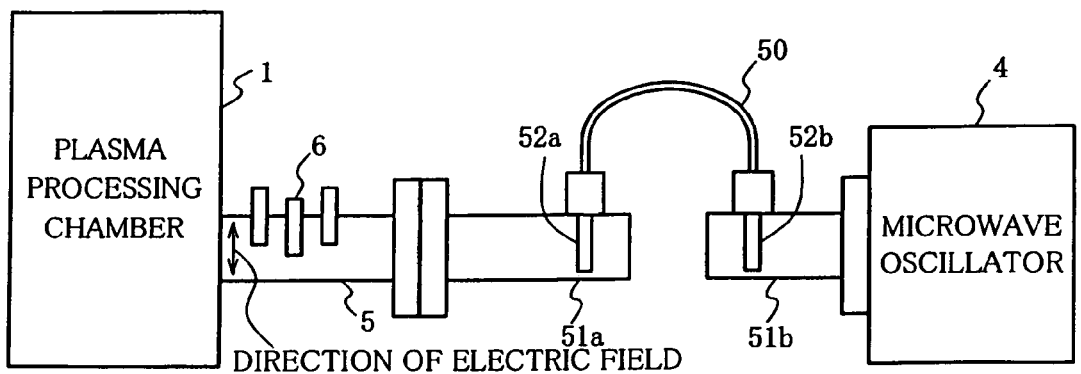
FIG. 2 are schematic arrangement views showing one example of connection form of a plasma processing chamber and a microwave oscillator in the microwave plasma processing apparatus according to the present invention.
Figure 2:
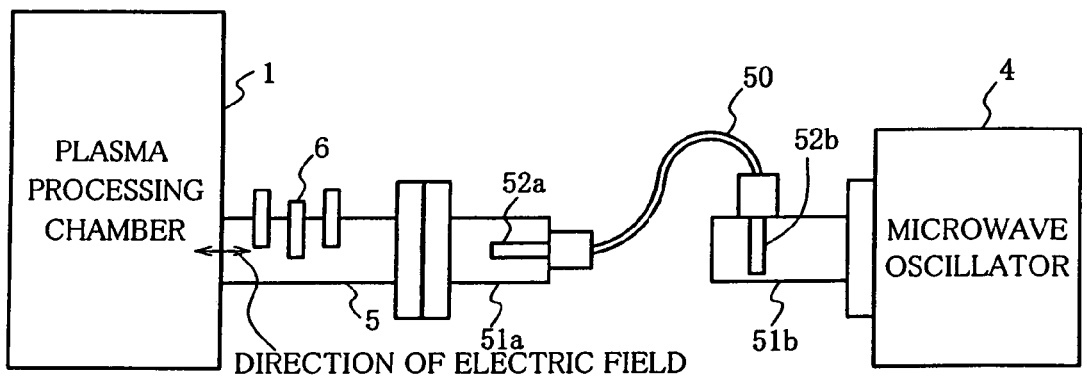
Figure 2:
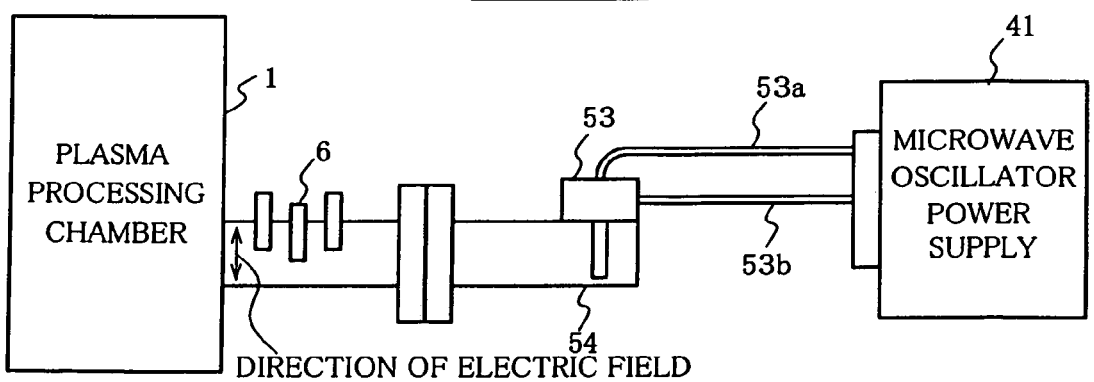

FIG. 2 show one example of connection forms of the microwave oscillator 4 and the processing chamber 1.

As shown in FIGS. 2(a) and (b), the waveguide 5 connected to the processing chamber 1 and the microwave oscillator 4 can be connected via a coaxial cable 50. In this case, coaxial waveguide converters 51a, 51b are respectively provided on the processing chamber 1 side and the microwave oscillator 4 side, and the coaxial cable 50 is connected to the coaxial waveguide converters 51a, 51b via antennas 52a, 52b.

At this point, depending on the position to attach the antenna 52a on the processing chamber 1 side, the microwave mode before the introduction into the processing chamber 1 can be set to the TE mode or the TM mode. More specifically, as shown in FIG. 2(a), the antenna 52a on the processing chamber 1 side can be attached at a position perpendicular to the waveguide 5 (the coaxial waveguide converter 51a) to set the microwave mode before the introduction into the processing chamber 1 to the TE mode.

On the other hand, as shown in FIG. 2(b), if the antenna 52 on the processing chamber 1 side is attached in parallel with the waveguide 5 (the coaxial waveguide converter 51a), the microwave mode before the introduction into the processing chamber 1 can be set to the TM mode.

Furthermore, as shown in FIG. 2(c), a microwave oscillation power supply 41 can be used instead of the microwave oscillator 4. In this case, a high-voltage cable 53a and a heater wire 53b led out from the microwave oscillation power supply 41 are connected to a magnetron 53 attached to the waveguide 5 (a magnetron mount 54) connected to the processing chamber 1 such that the microwaves from an antenna of the magnetron 53 are transmitted to the processing chamber 1.

Also in this case, a position to connect the magnetron 53 can be changed to set the microwave mode before the introduction into the processing chamber 1 to the TE mode or the TM mode, similarly to the antenna position of the coaxial cable shown in FIGS. 2(a) and (b). In other words, as shown in FIG. 2(c), the magnetron 53 can be attached perpendicularly to the waveguide 5 (magnetron mount 54) to set the microwave mode before the introduction into the processing chamber 1 to the TE mode.

On the other hand, if the magnetron 53 is attached in parallel with the waveguide 5 (magnetron mount 54), which is not shown, the microwave mode will be the TM mode.

In this manner, an electric field is directed horizontally (height direction) or vertically to a chamber wall at a connection portion of the chamber and the waveguide 5, as indicated by arrows in FIGS. 2(a) to (c).

[Plasma Processing Chamber]

Figure 3:
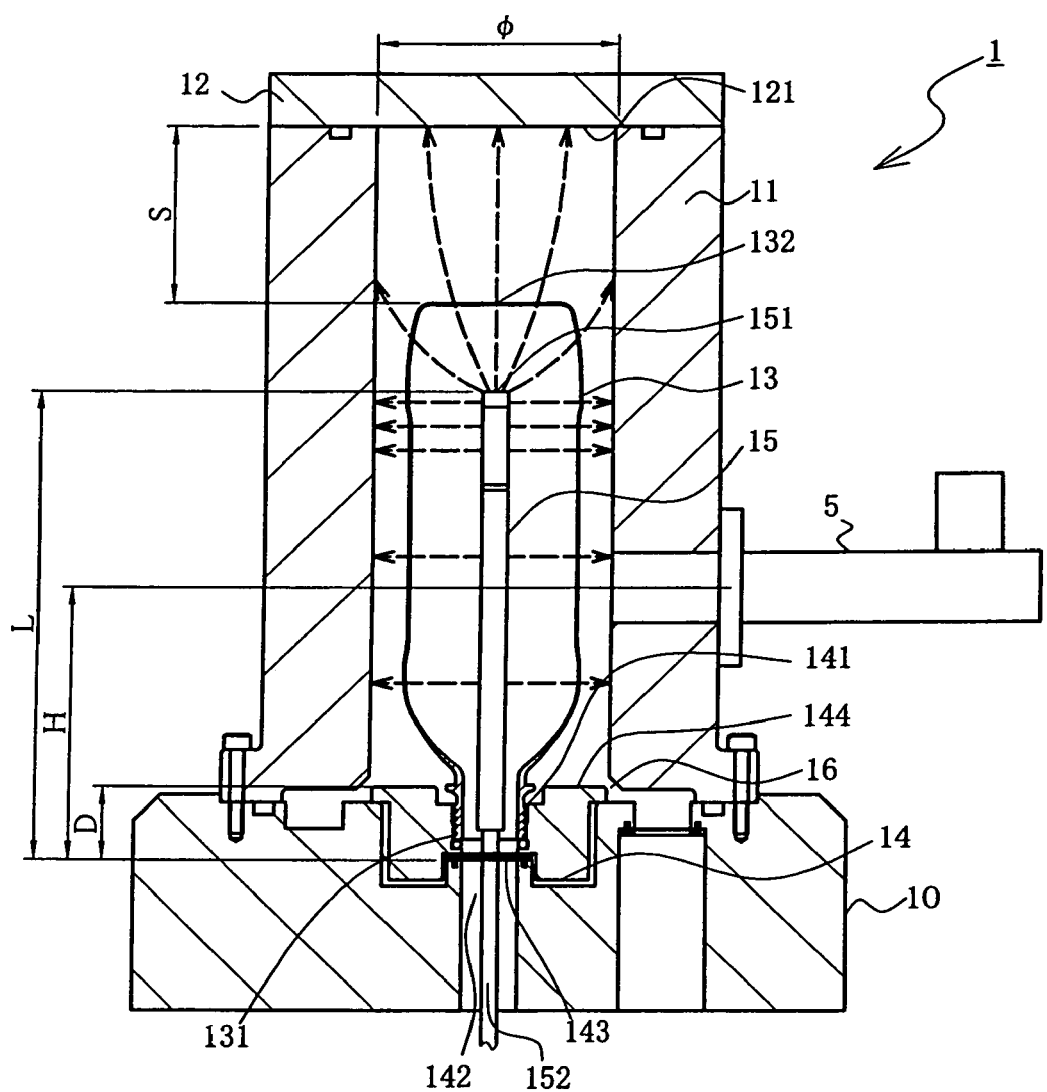
FIG. 3 is a schematic sectional view of the plasma processing chamber of the microwave plasma processing apparatus according to one embodiment of the present invention.

FIG. 3 is a schematic sectional view of the plasma processing chamber.

The plasma processing chamber 1 is constituted of a hollow chamber 11 mounted on a base table 10, a detachable canopy 12 located above the chamber 11, and bottle fixing means 14 for fixing a bottle 13 to be processed. The waveguide 5 for leading the microwaves generated by the microwave oscillator 4 to the plasma processing chamber 1 is connected to a side surface of the chamber 11.

The plasma processing chamber 1 forms a so-called microwave semi-coaxial cylindrical resonance system. In other words, this provides a configuration in which the cylindrical chamber 11 forms the plasma processing chamber 1, and a conductive processing gas supply member 15 is provided on the axis of the plasma processing chamber 1 such that an end portion thereof does not reach the canopy 12.

The bottle 13 has a mouth portion 131 gripped by the bottle fixing means 14, and is fixed on the axis of the chamber 1. The processing gas supply member 15 has been inserted into the bottle 13. In this state, a vacuum is formed inside and outside the bottle 13 by the vacuum pump 2, and the processing gas is supplied from the processing gas supply member 15 inserted in a central portion of the bottle 13, and then the microwaves are supplied from a side surface of the processing chamber 1.

For decompression inside the processing chamber 1, a gap 16 is provided between the chamber 11 and the bottle fixing means 14, and is connected to the exhaust tube 3 through the base table 10. In the same manner, an exhaust opening 142 provided in the bottle fixing means 14 is also connected to the exhaust tube 3 for decompression inside the bottle 13.

The bottle fixing means 14 is located under the chamber 11, and has a bottle grip portion 141 for gripping the mouth portion 131 of the bottle, the exhaust opening 142 for decompression inside the bottle 13, and a microwave sealing member 143 which is located immediately under the bottle grip portion 141, provided to cover the exhaust opening 142 and prevents the microwaves from leaking out of the processing chamber 1.

Alloy steels made of, for example, SUS, Al and Ti can be used as the microwave sealing member 143, which can transmit a gas so as not to prevent a decompression process inside the bottle 13 and can shut off the microwaves.

The bottle fixing means 14 is connected to a rod (not shown) which can ascend and descend. When the bottle 13 is attached to or detached from the bottle fixing means 14, the canopy 12 is opened, and the rod can be raised to move the bottle 13 (fixing means 14) outside the chamber 11.

The processing gas supply member 15 is connected to a processing gas supply device (not shown) via a processing gas supply tube 152 so that it penetrates the bottle fixing means 14 coaxially with the chamber 11, inserted to be located inside the bottle 13 and can supply the gas at a predetermined rate.

The width and shape of the supply member 15 are optionally decided in accordance with a chamber diameter and a bottle shape.

Metals such as SUS, Al and Ti can be used for material to form the supply member 15. When a chemical vapor deposition film is formed on the internal surface of the bottle 13, the use of a porous metal can provide satisfactory uniformity of a thin film layer to be obtained and improve flexibility and productivity, and is thus preferable.

One or more holes for releasing gas is formed in the processing gas supply member 15, and the position, size and number of holes can be optionally set.

It is preferable that the same kind of film as the film formed on the internal surface of the bottle 13 by plasma processing be formed on the surface of the processing gas supply member 15.

[Microwave Plasma Processing Method]

Next, the method of processing the bottle according to the present embodiment will be specifically described.

The bottle 13 is fixed to the bottle fixing means 14. At this point, the canopy 12 is removed from the chamber 11, and the bottle fixing means 14 is raised in the chamber 11 by the rod (not shown) to be located in an upper part of the chamber 11.

In this state, the mouth portion of the bottle 13 is gripped by the bottle grip portion 141, and the rod is lowered to dispose the bottle fixing means 14 at a predetermined position. Then, the canopy 12 is closed to seal the chamber 11, resulting in a state shown in FIG. 3.

Subsequently, the vacuum pump 2 is driven to decompress the inside of the bottle 13 so that a degree of vacuum is higher inside than outside the bottle 13.

If the plasma is produced with the degree of vacuum inside the bottle 13 higher than the degree of vacuum outside the bottle 13, the plasma concentrate in the vicinity of a wall surface of the bottle 13, so that the thin film layer can be efficiently formed on the bottle 13 in a short time.

The degree of decompression in the bottle 13 may be such that the glow discharge is caused when the processing gas is introduced and the microwaves are introduced. More specifically, the decompression is preferably performed within a range of 1 to 500 Pa, particularly 5 to 200 Pa for the efficient plasma processing.

It is to be noted that if the degree of vacuum inside the bottle 13 is higher than the degree of vacuum outside the bottle 13, the inside of the plasma processing chamber 1 may be decompressed. In this case, the degree of decompression is from, for example, 1000 to 10000 Pa such that the glow discharge is not caused even when the microwaves are introduced.

After this decompression state is achieved, the processing gas is supplied from the processing gas supply member 15 into the bottle 13.

The processing gas is preferably supplied at a flow volume of, as an example, 1 to 500 cc/min, particularly 2 to 200 cc/min per container under normal condition, depending on the surface area of the bottle 13 to be processed and the kind of processing gas.

When the thin film is formed through reactions of a plurality of processing gases, one of the processing gases can be excessively supplied. For example, when a silicone oxide film is formed, an oxygen gas is preferably supplied excessively as compared with a silicon source gas, and when nitride is formed, nitrogen or ammonia can be supplied excessively as compared with a metal source gas.

Subsequently, the microwaves are introduced into the plasma processing chamber 1 through the waveguide 5. The microwaves to be introduced are in the TE mode or the TM mode.

The microwaves to be introduced are set in the TE mode or the TM mode to be efficiently converted into the microwave mode in the plasma processing chamber indicated by broken lines in FIG. 3.

The introduced microwaves bring the processing gas into a high energy state, and into the plasma state. The processing gas transformed into plasma acts on the internal surface of the bottle 13 and deposits to form a coating film.

In the present embodiment, the microwaves introduced into the plasma processing chamber 1 form an area in the TE mode and an area mixing the TE mode and the TM mode in the plasma processing chamber 1. More specifically, the electric field is produced in a vertical direction from the processing gas supply member 15 to a sidewall of the chamber 11 up to the height at which the processing gas supply member 15 is inserted in the bottle 13 (from the mouth portion 131 of the bottle to a body portion 133 of the bottle). On the other hand, from a processing gas supply member end portion 151 to a canopy lower surface 121, the electric field is radially produced from the supply member end portion 151 to the side wall of the chamber 11 and the canopy lower surface 121 (indicated by the broken lines in FIG. 3).

Herein, the TE mode refers to the state of a standing wave of the microwaves in the plasma processing chamber in which the electric field is directed vertically to the central axis of the plasma processing chamber and a magnetic field is directed parallel with the central axis of the processing chamber.

Furthermore, the TM mode refers to the state of the standing wave of the microwaves in the plasma processing chamber in which the electric field is directed parallel with the central axis of the plasma processing chamber and the magnetic field is directed vertically to the central axis of the processing chamber.

In a conventional microwave processing apparatus disclosed in Japanese PCT Patent Application Laid-open No. 518685/2001, the standing wave of the microwaves in a microwave confining chamber is in the TM mode, and the electric field is formed in parallel with a central axis of the confining chamber. Therefore, because plasma produced inside the bottle is mainly acted on by the electric field in parallel with the central axis of the confining chamber, the plasma does not act efficiently on the wall surface of the bottle.

Furthermore, since strength distribution of the electric field is in parallel with the central axis of the confining chamber, the plasma tends to be nonuniform in a processing surface of the bottle, and the thin film layer to be formed tends to be nonuniform.

On the contrary, in the present embodiment, since the area in the TE mode and the area mixing the TE mode and the TM mode are formed in the plasma processing chamber 1 as described above such that the electric field is directed from the processing gas supply member 15 on the central axis of the plasma processing chamber 1 to the sidewall of the chamber 11, the produced plasma is accelerated from the vicinity of the center of the processing chamber 1 toward an inner wall of the bottle 13. Therefore, the plasma acts efficiently on the bottle 13 to reduce processing time.

Furthermore, since the strength distribution of the electric field is vertical to the central axis of the plasma processing chamber 1, the strength of the electric field has a relatively small fluctuation attributed to a difference in the position of the inner wall of the bottle 13. Therefore, the plasma on the inner wall of the bottle 13 is uniform, and the thin film to be formed is also uniform.

It is to be noted that the TE mode may be replaced with a TEM mode in the embodiment described above.

The TEM mode refers to the state of the standing wave in which both the electric field and the magnetic field are directed vertically to the central axis of the plasma processing chamber.

In this case, the plasma in the vicinity of the inner wall of the bottle can be more efficiently excited.

The frequency of microwave is not specifically limited as long as it can act on the processing gas to cause the glow discharge, but is preferably 2.45 GHz, 5.8 GHz and 22.125 GHz which are frequencies industrially permitted to use.

The microwaves are preferably introduced at an output of, as an example, 50 to 1500 W, particularly 100 to 1000 W per bottle, depending on the surface area of the bottle 13 and the kind of processing gas.

Furthermore, the processing time can not be specifically defined because it varies depending on, for example, the surface area of the bottle 13, the thickness of a thin film to be formed, and the kind of processing gas, but as an example, a time of one second or more is needed per bottle for stabilizing the plasma processing. Short time is preferable in terms of costs.

After the plasma processing has been performed, the supply of processing gas and the introduction of the microwaves are stopped, and air is gradually introduced through the exhaust tube 3, thereby returning the inside and outside of the bottle 13 to normal pressure. Subsequently, the canopy 12 is removed and the bottle fixing means 14 is raised to remove the bottle subjected to the plasma processing from the plasma processing chamber 1.

In the present embodiment, a distance (D) from an upper surface 144 of the bottle fixing means 14 to the microwave sealing member 143 is preferably from 0 mm to 55 mm, particularly 20 mm to 50 mm. With the distance (D) in this range, the processing chamber 1 forms an excellent resonance system, so that the strength distribution of the electric field based on the microwave is stabilized. Therefore, the production of plasma is also stabilized, and efficiency is improved in the use of introduced microwave energy.

Furthermore, in the present embodiment, the microwaves are preferably introduced at a position from the side surface of the chamber 11 at a height between the mouth portion 131 of the bottle and a bottom portion 132 of the bottle.

Especially, a distance (H) between the microwave sealing member and a connecting position of the microwave introducing means preferably satisfies a relationship of the following equation.

$$H = L - (n_2 \lambda/2 + \lambda/8 - 3) + \beta \text{(mm)}$$

[$n_2$ is an integral number satisfying $n_2 \leq n_1 - 1$, $\lambda$ is a wavelength of the microwave, $\beta$ is a margin of fluctuation ±10 mm due to the size or the like of a base substance, and L is a distance between the microwave sealing member and the processing gas supply member end portion and satisfies the following relationships.

A. When $0 \leq D < 20$ $$L = (n_1 \lambda/2 + \lambda/8) - 3 + \alpha$$

B. When $20 \leq D \leq 35$ $$L = (n_1 \lambda/2 + \lambda/8) - (-0.060\, D^2 + 4.2\, D - 57) + \alpha$$

C. When $35 < D \leq 55$ $$L = (n_1 \lambda/2 + \lambda/8) - (-0.0.030\, D^2 + 2.1\, D - 21) + \alpha$$

[$n_1$ is an integral number higher than 1, $\lambda$ is the wavelength of the microwave, and $\alpha$ is a margin of fluctuation ±10 mm in consideration of an influence of the base substance on the electric field and the like.]

The equation indicated above was obtained from experiment results and analyses by a computer program. H obtained from this equation indicates a node of the strength distribution of the electric field formed on the processing gas supply member 15 by introducing the microwaves, that is, a part where density of electric field is low. The waveguide 5 can be connected as high as this part to minimize a reflected wave that moves backward through the waveguide 5 without being consumed in the processing chamber 1. In other words, the introduced microwaves can be efficiently utilized in transforming the processing gas into plasma.

Furthermore, with the distance (L) satisfying the above relational equations, the strength of the electric field formed in the processing chamber 1 by the introduced microwaves can be totally enhanced, and the strength distribution of the electric field can be stabilized. Therefore, the energy of the introduced microwaves can be efficiently used for the production of plasma, and the internal surface of the bottle can be uniformly processed because the state of plasma is stable and uniform.

For example, when a microwave at a frequency of 2.45 GHz is used, the wavelength of this microwave is about 120 mm. When the distance (D) from the upper surface 144 of the bottle fixing means 14 to the microwave sealing member 143 is 30 mm, the above equation is satisfied, and a value of the distance (L) at which stable plasma emission is obtained is 60±10 mm, 120±10 mm, 180±10 mm or the like.

The distance (H) between the microwave sealing member and the connecting position of the microwave introducing means at this point is 48 mm, 108 mm, 168 mm or the like.

It is preferable to select a length from the values of H and L to locate the processing gas supply member end portion 151 at a position as close to the bottom portion 132 of the bottle as possible in accordance with the shape, size or the like of the bottle 13 to be processed so that a deposit film with a uniform thickness can be formed on the entire surface of the bottle 13.

For example, the distance (L) is preferably from 170 mm to 190 mm for the processing of general bottle containers having a capacity of 500 mm, and is preferably from 110 mm to 130 mm for the processing of bottle containers having a capacity of 350 mm.

It is to be noted that the waveguide 5 is connected at one place in the present embodiment, but may be connected at a plurality of positions of H that satisfies the above equation.

In addition, a distance (S) from the bottom portion 132 of the bottle to the canopy lower surface 121 is preferably from 5 mm to 150 mm. This range makes it possible to improve the integrity of microwave with the chamber 11, thus allowing the strength distribution of the electric field in the processing chamber 1 to be more stable. Especially, a distance of 30 mm to 100 mm is preferable.

Furthermore, an inside diameter φ of the processing chamber 1 is preferably from 40 mm to 150 mm. With the inside diameter of the processing chamber 1 in this range, an electric field concentration effect on the center of the processing chamber 1 is exerted, which is more effective. Especially, an inside diameter of 65 mm to 120 mm is preferable.

[Bottle Container to be Processed]

Bottles made of plastics can be processed in the present embodiment.

The plastics include known thermoplastic resins, for example, a polyolefin such as low density polyethylene, high density polyethylene, polypropylene, poly(1-butene), or poly(4-methyl-1-pentene); a random copolymer or a block copolymer made of α-olefin such as ethylene, propylene, 1-butene, or 4-methyl-1-pentene; an ethylene-vinyl compound copolymer such as ethylene-vinylacetate copolymer, ethylene-vinylalcohol copolymer, or ethylene-vinylchloride copolymer; a styrene resin such as polystyrene, acrylonitrile-styrene copolymer, ABS, or α-methylstyrene-styrene copolymer; a polyvinyl compound such as polyvinyl chloride, polyvinylidene chloride, vinyl chloride-polyvinylidene chloride copolymer, polyacrylic methyl, or polymethyl methacrylate; a polyamide such as nylon 6, nylon 6,6, nylon 6,10, nylon 11, or nylon 12; a thermoplastic polyester such as polyethylene terephthalate, polybutylene terephthalate, or polyethylene naphthalate; and polycarbonate, polyphenylene oxide, polylactic acid, or the like. These resins may be singly used, or may be used in the form of a mixture or a multilayer of two or more kinds of them. Moreover, a multilayer plastic container provided with an oxygen absorbent, various kinds of aqueous materials or an oxygen barrier material as an intermediate layer is also possible.

The present embodiment can also be applied to various kinds of glasses, ceramics or porcelains in addition to the plastics; an oxide-based ceramic such as alumina, silica, titania or zirconia; a nitride-based ceramic such as aluminum nitride, boron nitride, titanium nitride, silicon nitride or zirconium nitride; a carbide-based ceramic such as silicon carbide, boron carbide, tungsten carbide, or titanium carbide; a boride-based ceramic such as silicon boride, titan boride, or zirconium boride; a high dielectric ceramic such as rutile, magnesium titanate, zinc titanate, or rutile-lanthanum oxide; a piezoelectric ceramic such as titanate; and various kinds of ferrites, or the like.

It is to be noted that the present invention is not limited to the embodiment described above, and can also be applied to general containers such as cups in addition to the bottles, and to processing of base substances having a tube-shape or the like.

[Processing Gas]

Various kinds of gasses can be used as the processing gas in accordance with an object of the plasma processing.

For example, in order to improve gas barrier properties of the plastic container, a compound containing atoms, molecules or ions that constitute the thin film is brought into vapor phase state, and used together with a proper carrier gas. The compound to make the thin film needs to be highly volatile.

As a specific example, a carbon hydride such as methane, ethane, ethylene or acetylene is used to form a carbon film or a carbide film.

For the formation of a silicon film, there is used silicon tetrachloride, silane, an organic silane compound, an organic siloxane compound, or the like.

For the formation of an oxide film, oxygen gas is used, and for the formation of a nitride film, nitrogen gas or ammonia gas is used.

Furthermore, for the surface modification of the plastic, carbon gas is used to introduce a cross-linking structure on the surface of the plastic, or fluorine gas can be used to give the surface of the plastic the same characteristics as polytetrafluoroethylene, for example, nonadhesive properties, a low friction coefficient, heat resisting properties and chemical resistance.

In addition, it is also possible to use halide (chloride) such as titan, zirconium, tin, aluminum, yttrium, molybdenum, tungsten, gallium, tantalum, niobium, iron, nickel, chrome, or boron; and organic metallic compounds.

Two or more kinds of these processing gases can be used in a suitable combination in accordance with the chemical composition of the thin film to be formed.

On the other hand, argon, neon, helium, xenon or hydrogen is suitable for the carrier gas.

INDUSTRIAL APPLICABILITY

As described above, the microwave plasma processing method according to the present invention is useful in that the uniform thin film layer can be formed on the surface of the base substance in a short time by adjusting the standing wave of the microwave in the plasma processing chamber and forming the electric field vertically to the processing surface of the base substance and by producing an almost uniform electric field strength in the processing surface of the base substance.

The invention claimed is:

1. A microwave plasma processing method for introducing microwaves into a plasma processing chamber, and transforming a processing gas into plasma to form a thin film layer on a base substance disposed in the plasma processing chamber, the method characterized by:
    fixing the base substance coaxially with a central axis of the plasma processing chamber;
    setting a standing wave mode of the microwaves in the plasma processing chamber to a TE mode or a TEM mode from a mouth portion to a body portion of the base substance; and
    setting a mode having both the TE mode and a TM mode in a bottom portion of the base substance.

2. The microwave plasma processing method according to claim 1, comprising inserting a metallic processing gas supply member into the base substance on the central axis of the plasma processing chamber so as not to reach the bottom portion of the base substance.

3. The microwave plasma processing method according to claim 1, comprising supplying the microwaves to the plasma processing chamber from a side surface of the plasma processing chamber at a position between the mouth portion and the bottom portion of the base substance.

4. The microwave plasma processing method according to claim 1, wherein a mode of the microwaves before introduced into the plasma processing chamber is set to the TE mode and the TM mode.

5. The microwave plasma processing method according to claim 1, wherein a degree of vacuum inside the base substance is higher than a degree of vacuum outside the base substance.

* * * * *